(12) United States Patent
Cho

(10) Patent No.: US 9,572,267 B2
(45) Date of Patent: Feb. 14, 2017

(54) WINDOW MEMBER IN A CURVED DISPLAY DEVICE, METHOD OF MANUFACTURING A WINDOW MEMBER OF A CURVED DISPLAY DEVICE, AND CURVED DISPLAY DEVICE HAVING THE SAME

(71) Applicant: SAMSUNG DISPLAY CO., LTD., Yongin, Gyeonggi-Do (KR)

(72) Inventor: Jong-Whan Cho, Ansan-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/493,854

(22) Filed: Sep. 23, 2014

(65) Prior Publication Data

US 2015/0103474 A1 Apr. 16, 2015

(30) Foreign Application Priority Data

Oct. 10, 2013 (KR) .................. 10-2013-0120244
Apr. 30, 2014 (KR) .................. 10-2014-0052247

(51) Int. Cl.
*H05K 5/00* (2006.01)
*B29C 39/12* (2006.01)
*B32B 1/00* (2006.01)
*B29C 45/00* (2006.01)
*B29C 65/48* (2006.01)
(Continued)

(52) U.S. Cl.
CPC ............ *H05K 5/0017* (2013.01); *B29C 39/12* (2013.01); *B29C 45/0001* (2013.01); *B29C 65/4855* (2013.01); *B32B 1/00* (2013.01); *B32B 7/12* (2013.01); *B32B 27/08* (2013.01); *B32B 27/281* (2013.01); *B32B 27/308* (2013.01); *B32B 27/36* (2013.01); *B32B 27/365* (2013.01); *E04C 2/20* (2013.01); *E04C 2/24* (2013.01); *E04C 2/54* (2013.01); *H05K 5/03* (2013.01); *B29K 2033/08* (2013.01); *B29K 2067/003* (2013.01); *B29K 2069/00* (2013.01); *B29K 2077/00* (2013.01); *B29L 2031/778* (2013.01); *B32B 2307/412* (2013.01); *B32B 2307/536* (2013.01); *B32B 2457/20* (2013.01); *E04C 2002/005* (2013.01); *E06B 2003/67395* (2013.01); *Y10T 428/24479* (2015.01); *Y10T 428/24628* (2015.01)

(58) Field of Classification Search
CPC ... H04M 1/0266; H04M 1/0268; B29C 39/12; B32B 2307/412; H05K 5/0017; H05K 5/03
USPC ..................................... 361/679.21, 679.01
See application file for complete search history.

(56) References Cited

U.S. PATENT DOCUMENTS 7,310,050 B2 12/2007 Yeh
7,426,107 B2 9/2008 Yeh et al.
(Continued)

FOREIGN PATENT DOCUMENTS

EP 1 327 510 A1 7/2003
EP 1 914 067 A2 4/2008
(Continued)

*Primary Examiner* — Courtney Smith
*Assistant Examiner* — Jessey R Ervin
(74) *Attorney, Agent, or Firm* — Lee & Morse, P.C.

(57) ABSTRACT

A window member in a curved display device includes a window body having a flat portion and a curved portion. A first radius of curvature of an inner surface of the curved portion may be different from a second radius of curvature of an outer surface of the curved portion.

13 Claims, 9 Drawing Sheets

(51) Int. Cl.
*E04C 2/20* (2006.01)
*E04C 2/24* (2006.01)
*E04C 2/54* (2006.01)
*H05K 5/03* (2006.01)
*B32B 7/12* (2006.01)
*B32B 27/08* (2006.01)
*B32B 27/28* (2006.01)
*B32B 27/30* (2006.01)
*B32B 27/36* (2006.01)
*B29K 33/00* (2006.01)
*B29K 67/00* (2006.01)
*B29K 69/00* (2006.01)
*B29K 77/00* (2006.01)
*B29L 31/00* (2006.01)
*E04C 2/00* (2006.01)
*E06B 3/673* (2006.01)

(56) References Cited

U.S. PATENT DOCUMENTS

| | | | |
|---|---|---|---|
| 8,619,414 B2 * | 12/2013 | Lee | H04N 5/64 |
| | | | 345/214 |
| 2010/0267879 A1 | 10/2010 | Isozaki et al. | |
| 2011/0273383 A1 | 11/2011 | Jeon et al. | |
| 2012/0288661 A1 | 11/2012 | Wei | |
| 2012/0320509 A1 | 12/2012 | Kim et al. | |
| 2013/0000822 A1 | 1/2013 | Kim et al. | |
| 2013/0002572 A1 | 1/2013 | Jin et al. | |
| 2013/0002583 A1 | 1/2013 | Jin et al. | |
| 2013/0034685 A1 * | 2/2013 | An | H01L 51/524 |
| | | | 428/121 |
| 2013/0036638 A1 | 2/2013 | Kwack et al. | |
| 2013/0083464 A1 | 4/2013 | Beeze et al. | |
| 2013/0342429 A1 * | 12/2013 | Choi | H05K 13/00 |
| | | | 345/30 |
| 2014/0002975 A1 * | 1/2014 | Lee | H05K 5/0017 |
| | | | 361/679.01 |
| 2014/0118271 A1 * | 5/2014 | Lee | G06F 3/0488 |
| | | | 345/173 |
| 2014/0198436 A1 * | 7/2014 | Lim | H04M 1/0266 |
| | | | 361/679.01 |
| 2014/0233194 A1 * | 8/2014 | Hongo | H05K 1/0283 |
| | | | 361/749 |

FOREIGN PATENT DOCUMENTS

| | | |
|---|---|---|
| JP | 2007-190794 | 8/2007 |
| JP | 2013-003306 A | 1/2013 |
| KR | 20-0328691 | 10/2003 |
| KR | 10-2009-0010012 A | 1/2009 |
| KR | 10-2010-0072040 | 6/2010 |
| KR | 10-0994102 A | 11/2010 |
| KR | 10-2012-0013265 A | 2/2012 |
| KR | 10-2012-0116813 A | 10/2012 |
| KR | 10-2013-0007068 | 1/2013 |
| KR | 10-2013-0007312 A | 1/2013 |
| KR | 2013-0091225 | 8/2013 |
| KR | 10-2014-0103547 | 8/2014 |

* cited by examiner

WINDOW MEMBER IN A CURVED DISPLAY DEVICE, METHOD OF MANUFACTURING A WINDOW MEMBER OF A CURVED DISPLAY DEVICE, AND CURVED DISPLAY DEVICE HAVING THE SAME

CROSS-REFERENCE TO RELATED APPLICATION

Korean Patent Application No. 10-2013-0120244, filed on Oct. 10, 2013, in the Korean Intellectual Property Office, and entitled: "Window Member In A Curved Display Device, Method Of Manufacturing A Window Member Of A Curved Display Device, And Curved Display Device Having The Same," and Korean Patent Application No. 10-2014-0052247, filed on Apr. 30, 2014, in the Korean Intellectual Property Office, and entitled: "Window Member In A Bended Display Device, Method Of Manufacturing A Window Member Of A Bended Display Device, And Bended Display Device Having The Same," are incorporated by reference herein in its entirety.

BACKGROUND

1. Field

Example embodiments relate to display devices. More particularly, example embodiments relate to curved display devices including window members.

2. Discussion of Related Art

Unlike display devices including a glass substrate, flexible and/or curved display devices including flexible materials such as plastic substrates or plastic films have been recently developed.

SUMMARY

Example embodiments provide a window member, a method of manufacturing the window member, and a curved display device including the window member.

A window member in a curved display device may include a window body having a flat portion. A first radius of curvature of an inner surface of the curved portion may be different from a second radius of curvature of an outer surface of the curved portion.

In example embodiments, the first radius of curvature may be greater than the second radius of curvature.

In example embodiments, the first radius of curvature may be smaller than the second radius of curvature.

A thickness of the curved portion of the window body may be thicker than a thickness of the flat portion of the window body.

The window body may be formed by an injection molding process that injects a melted transparent resin into a mold. The transparent resin may include at least one of polycarbonate (PC) or polymethylmethacrylate (PMMA).

The window member may further include a transparent polymer resin layer disposed on the window body, and a protection layer disposed on the transparent polymer resin layer.

The transparent poly resin layer may include at least one of polyethylene-terephthalate (PET) or polyimide (PI). The window body may be attached to the transparent polymer resin layer by at least one of optically clear adhesive (OCA) or binder.

The protection layer may include an anti-reflection layer or an anti-fingerprint layer.

A method of manufacturing a window member of a curved display device may include forming a window body having a flat portion and a curved portion by injecting a melted transparent resin into a mold, disposing a protection layer on a transparent polymer resin layer, and attaching the transparent polymer resin layer onto the window body. A first radius of curvature of an inner surface of the curved portion may be different from a second radius of curvature of an outer surface of the curved portion.

In example embodiments, the first radius of curvature may be greater than the second radius of curvature.

In example embodiments, a thickness of the curved portion of the window body may be thicker than a thickness of the flat portion of the window body.

Attaching the transparent polymer resin layer onto the window body may include attaching at least one of optically clear adhesive (OCA) or binder to the transparent polymer resin layer, and attaching the transparent polymer resin layer to the window body using the at least one of the optically clear adhesive (OCA) or the binder.

The transparent resin may include at least one of polycarbonate (PC) or polymethylmethacrylate (PMMA). The transparent polymer resin layer may include at least one of polyethylene-terephthalate (PET) or polyimide (PI).

The protection layer may include an anti-reflection layer or an anti-fingerprint layer.

A curved display device may include a display panel including a curved display region, a functional panel disposed on the display panel, and a window member disposed on the functional panel, the window member including a window body that has a curved portion corresponding to the curved display region of the display panel and a flat portion. A first radius of curvature of an inner surface of the curved portion may be different from a second radius of curvature of an outer surface of the curved portion.

In example embodiments, the first radius of curvature may be greater than the second radius of curvature.

In example embodiments, a thickness of the curved portion of the window body may be thicker than a thickness of the flat portion of the window body.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
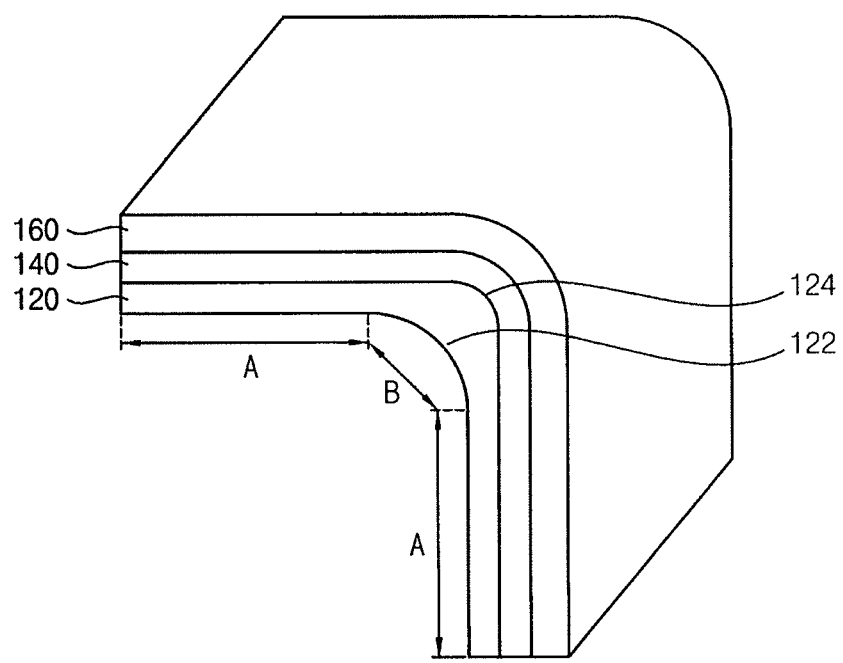
FIG. 1 illustrates a perspective view illustrating a window member in a curved display device according to example embodiments.

The example embodiments are described more fully hereinafter with reference to the accompanying drawings. The inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a perspective view illustrating a window member in a curved display device according to example embodiments.

Referring to FIG. 1, the window member 100 in the curved display device may include a window body 120. The window member 100 may further include a transparent polymer resin layer 140 on the window body 120, and a protection layer 160 disposed on the transparent polymer resin layer 140.

The window body 120 may protect inner portions of the display device, while passively transferring images generated by the display device (e.g., a display panel). In the curved display device, the window body 120 may include at least one flat portion A and at least one curved portion B. Thus, images generated by the display device may be displayed not only at the flat portion A but also at the curved portion B.

A first radius of curvature of an inner surface 122 of the curved portion B of the window body 120 may be different from a second radius of curvature of an outer surface 124 of the curved portion B of the window body 120.

In example embodiments, the first radius of curvature of the inner surface 122 of the curved portion B of the window body 120 may be greater than the second radius of curvature of an outer surface 124 of the curved portion B of the window body 120. For example, the first radius of curvature of the inner surface 122 may be set to about 5.8R, and the second radius of curvature of the outer surface 124 may be set to about 5R, where R represents a predetermined value or constant of a radius. Thus, the window body 120 may be formed such that the first radius of curvature of the inner surface 122 of the curved portion B of the window body 120 may be greater about 5.8/5 times than the second radius of curvature of the outer surface 124 of the curved portion B. Then, unintended refraction of light and unintended light scattering may be reduced, so that shadows of a curved display region may not appear (or, may be reduced). In example embodiments, the first radius of curvature of the inner surface 122 of the curved portion B of the window body 120 may be smaller than the second radius of curvature of an outer surface 124 of the curved portion B of the window body 120. For example, the first radius of curvature may be set to about 5R, and the second radius of curvature may be set to about 6R.

In example embodiments, a thickness of the curved portion B of the window body 120 may be thicker than a thickness of the flat portion A of the window body 120. In example embodiments, the flat portion A may have substantially uniform thickness.

In example embodiments, the window body 120 may be formed by an injection molding process that injects a melted transparent resin into a mold. The mold may be designed such that a first molding side of the mold corresponding to the inner surface 122 of the curved portion B of the window body 120 has a radius of curvature greater than that of a second molding side of the mold corresponding to the outer surface 124 of the curved portion B of the window body 120. Thus, the window body 120 formed by the mold such that the first radius of curvature of the inner surface 122 of the curved portion B may be greater than the second radius of curvature of the outer surface 124 of the curved portion B. In example embodiments, the window body 120 may include a plurality of curved portions and may have various radiuses of curvature through various shapes of the mold. For example, the second radius of curvature may be greater than the first radius of curvature (i.e., the radius of curvature of the inner surface 122 of the curved portion B may be smaller than the radius of curvature of the outer surface 124 of the curved portion B).

In example embodiments, the transparent resin included in the window body 120 may include at least one polycarbonate (PC) or polymethylmethacrylate (PMMA). The PC and the PMMA may be stronger and more flexible than conventional glasses. Further, the window body 120 may be formed easily by an injection molding process using the PC or the PMMA. Thus, the PC and the PMMA may form the window body 120 in the curved display device. However, the transparent resin in the window body 120 is not limited thereto. For example, the transparent resin may include a mixed plastic material including mixed PC and PMMA.

The transparent polymer resin layer 140 may be disposed on the window body 120. The transparent polymer resin layer 140 may prevent a surface of the window body 120 from being damaged. In example embodiments, the transparent polymer resin layer 140 may include at least one polyethylene-terephthalate (PET) or polyimide (PI). The transparent polymer resin layer 140 may be attached onto the window body 120 as a film or a coating layer. The PET and the PI may have good strength, good electrical insulation characteristics, good durability from chemicals, low thermal contraction, and low gas permeability. Thus, physical and chemical reliability of the window member 100 may be improved. However, the material in the transparent polymer resin layer 140 is not limited thereto. For example, the transparent polymer resin layer 140 may include acrylic urethane, epoxy, polyester, etc.

In example embodiments, the window body 120 may be attached to the transparent polymer resin layer 140 by at least one of optically clear adhesive (OCA) or a binder. The OCA and the binder may be sprayed onto an inner surface of the transparent polymer resin layer 140, or may be attached onto the inner surface of the transparent polymer resin layer 140. Then, the inner surface of the transparent polymer resin layer 140 may be attached onto an outer surface of the window body 120. Thus, a shape of the transparent polymer resin layer 140 may correspond to a shape of the outer surface of the window body 120. A method of attaching the transparent polymer resin layer 140 onto the window body 120 may be performed by a laminating process. However, the method of attaching the transparent polymer resin layer 140 onto the window body 120 is not limited thereto.

The binder is a material that attaches the transparent polymer resin layer 140 onto the window body 120. The binder may include an inorganic binder (e.g., epoxy, phenol, etc), an organic binder (e.g., sodium silicate, sodium calcium, etc), or a hybrid binder of the organic binder and the inorganic binder.

The protection layer 160 may be disposed on the transparent polymer resin layer 140 and may improve surface hardness of the window member 100. In example embodiments, the protection layer 360 may include a high hardness material having hardness substantially equal to and higher than 5H. The protection layer 160 may include a transparent material that is a mixture of an organic material and an inorganic material. The protection layer 160 may be formed as a film or a coating layer on the transparent polymer resin layer 140. For example, the protection layer 160 may include a mixture of a glass material and a transparent polymer resin. In example embodiments, the protection layer 160 may include an anti-reflection (coating) layer to prevent external light reflections and/or anti-fingerprint (coating) layer. However, functions of the protection layer 160 and materials in the protection layer 160 are not limited thereto. For example, the protection layer 160 may be act as an antifouling layer.

As described above, the window member 100 may include the window body 120 formed with the first radius of curvature different from the second radius of curvature so that shadows of a curved display region may not appear (or, may be reduced). Thus, image distortions at a curved display region may be prevented. Further, White Angular Dependency (WAD) at the side view of the display device may be improved.

In addition, when the first radius of curvature is greater than the second radius of curvature, a display panel under the inner surface of the window body may be gently bent and thus tension (or stress) applied to the display panel may be reduced.

Figure 2:
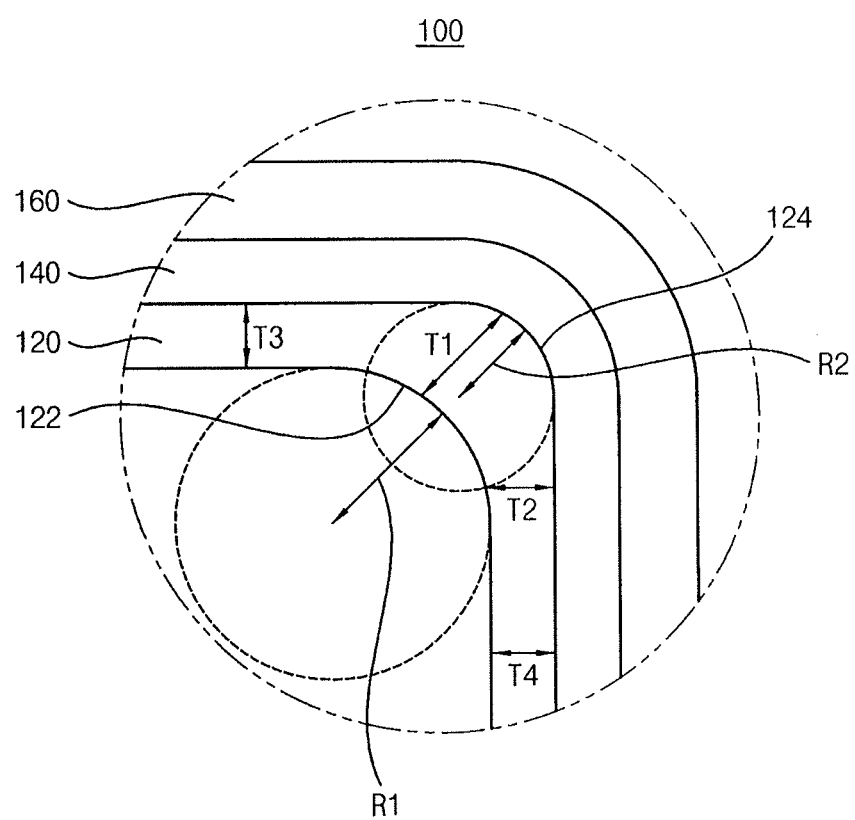
FIG. 2 illustrates a cross-sectional view illustrating an example of a portion of the window member of FIG. 1.

FIG. 2 illustrates a cross-sectional view illustrating an example of a portion of the window member of FIG. 1.

Referring to FIG. 2, a first radius of curvature R1 of an inner surface 122 of a curved portion of a window body 120 may be greater than a second radius of curvature R2 of an outer surface 124 of the curved portion of the window body 120. In example embodiments, a flat portion may have a substantially uniform thickness. Thus, a thickness of an end of the curved portion T2 of the window body 120 may be substantially the same as a thickness of the flat portion T3 and T4. Further, in example embodiments, a thickness of the curved portion T1 of the window body 120 may be thicker than a thickness of the flat portion T3 and T4 of the window body 120. For example, when the second radius of curvature R2 is set to about 5R, the first radius of curvature R1 may be from about 5.2R to about 6.5R, where R represents a predetermined value or constant of a radius. Thus, the thickness of the curved portion T1 of the window body 120 may be about 20% to about 30% thicker than the thickness of the flat portion T3 and T4 of the window body 120. In exemplary embodiments, shadows of the curved display region and distortions of the curved display region caused by light refracting and light scattering may not appear (or may be reduced). The thickness of the curved portion (i.e., the first radius of curvature R1 and the second radius of curvature R2) is not limited thereto. The ratio of the first radius of curvature R1 to the second radius of curvature R2 may be any ratio (or any value) that prevents shadows at the curved display region or distortions at the curved display region.

Thus, the second radius of curvature R2 may be greater than the first radius of curvature R1, also.

In example embodiments, the window body 120 may be formed by an injection molding process that injects a melted transparent resin into a mold.

The window member 100 may further include a transparent polymer resin layer 140 on the window body 120 and a protection layer 160 on the transparent polymer resin layer 140. As these are described above, duplicative descriptions will not be repeated.

Figure 3:
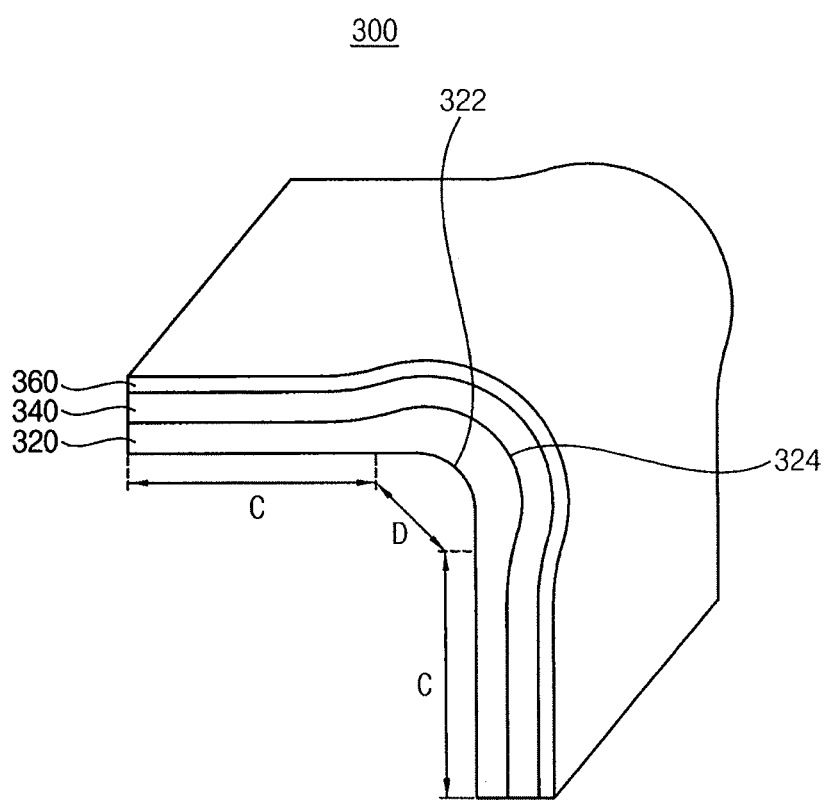
FIG. 3 illustrates a perspective view illustrating a window member in a curved display device according to example embodiments.
Figure 4:
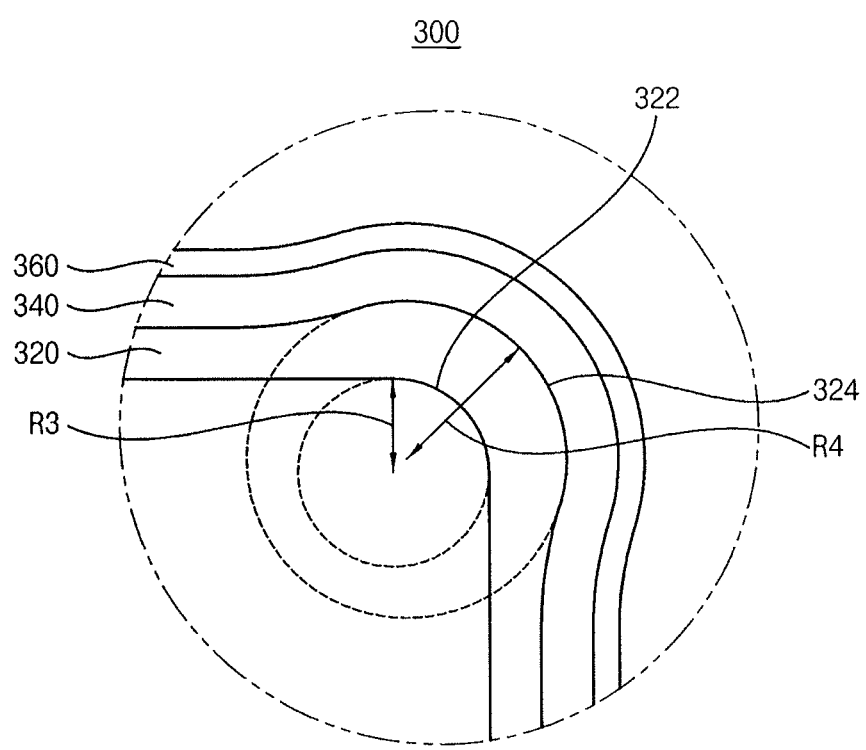
FIG. 4 illustrates a cross-sectional view illustrating an example of a portion of the window member of FIG. 3.

FIG. 3 illustrates a perspective view illustrating a window member in a curved display device according to example embodiments, and FIG. 4 illustrates a cross-sectional view illustrating an example of a portion of the window member of FIG. 3. Detailed descriptions on elements and/or constructions substantially the same as or similar to those illustrated with reference to FIG. 1 are omitted.

Referring to FIGS. 3 and 4, the window member 300 in the curved display device may include a window body 320. The window member 300 may further include a transparent polymer resin layer 340 on the window body 320, and a protection layer 360 on the transparent polymer resin layer 340.

As illustrated in FIG. 3, in the curved display device, the window body 320 may include at least one flat portion C and at least one curved portion D. Thus, images generated by the display device may be displayed not only at the flat portion C but also at the curved portion D. A first radius of curvature of an inner surface 322 of the curved portion D of the window body 320 may be smaller than a second radius of curvature of an outer surface 324 of the curved portion D of the window body 320. In example embodiments, the window body 320 may be formed by an injection molding process that injects a melted transparent resin into a mold. The window body 320 may include a plurality of curved portions and may have various radiuses of curvature through various shapes of the mold. In example embodiments, the transparent resin included in the window body 320 may include at least one polycarbonate (PC) or polymethylmethacrylate (PMMA).

In example embodiments, the transparent polymer resin layer 340 may be disposed on the window body 320. The transparent polymer resin layer 340 may prevent a surface of the window body 320 from being damaged. In example embodiments, the transparent polymer resin layer 340 may include at least one polyethylene-terephthalate (PET) or polyimide (PI). In example embodiments, the window body 320 may be attached to the transparent polymer resin layer 340 by at least one of optically clear adhesive (OCA) or a binder.

The protection layer 360 may be disposed on the transparent polymer resin layer 340 and may improve surface hardness of the window member 300. In example embodiments, the protection layer 360 may include a high hardness material having hardness substantially equal to and higher than 5H. In example embodiments, the protection layer 360 may include an anti-reflection (coating) layer to prevent external light reflections and/or anti-fingerprint (coating) layer. However, functions of the protection layer 360 and materials in the protection layer 360 are not limited thereto. For example, the protection layer 360 may be act as an antifouling layer.

As illustrated in FIG. 4, in example embodiments, the first radius of curvature R3 of the inner surface 322 of the curved portion of the window body 320 may be smaller than the second radius of curvature R4 of the outer surface 324 of the curved portion of the window body 320. Thus, unintended refraction of light and unintended light scattering may be reduced, so that shadows of a curved display region may not appear (or, may be reduced). In example embodiments, a flat portion of the window body 320 may have a substantially uniform thickness.

In example embodiments, the window body 320 having the first radius of curvature R3 and the second radius of curvature R4 may be formed by an injection molding process that injects a melted transparent resin into a mold.

The transparent resin layer 340 and the protection layer 360 may have substantially uniform thicknesses, respectively. However, the thicknesses of the transparent resin layer 340 and the protection layer 360 are not limited thereto.

Figure 5:
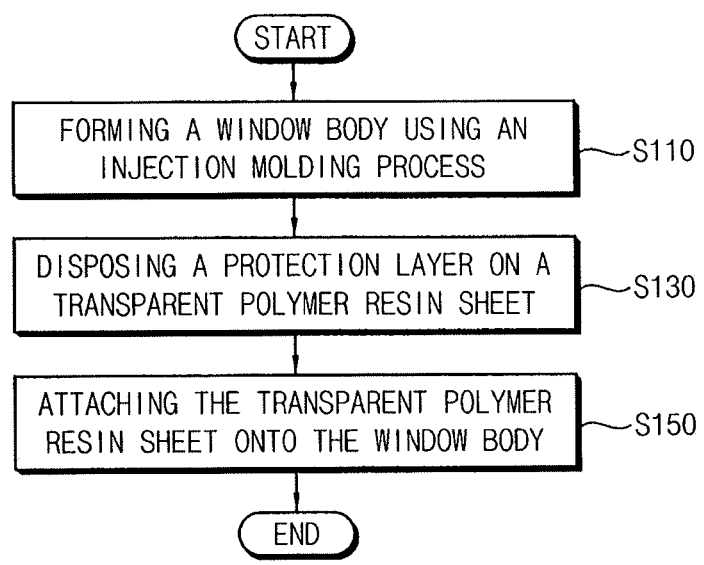
FIG. 5 illustrates a flow chart illustrating a method of manufacturing a window member in a curved display device according to example embodiments.
Figure 6A:
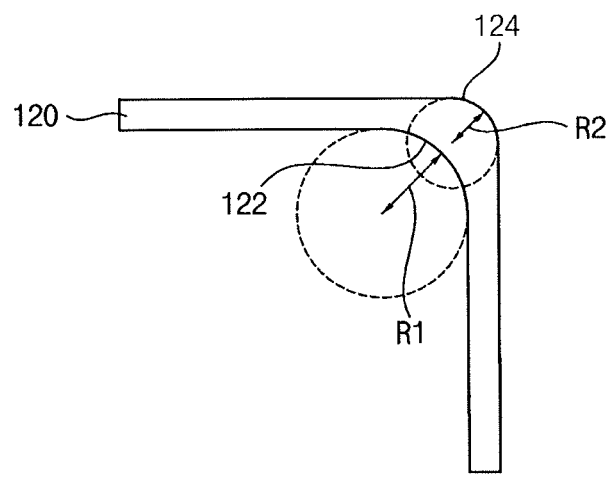
FIGS. 6A through 6C illustrate cross-sectional views describing an example of a method of manufacturing the window member of FIG. 5.
Figure 6B:
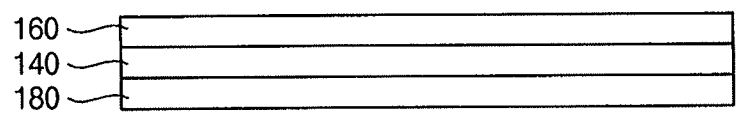
Figure 6C:
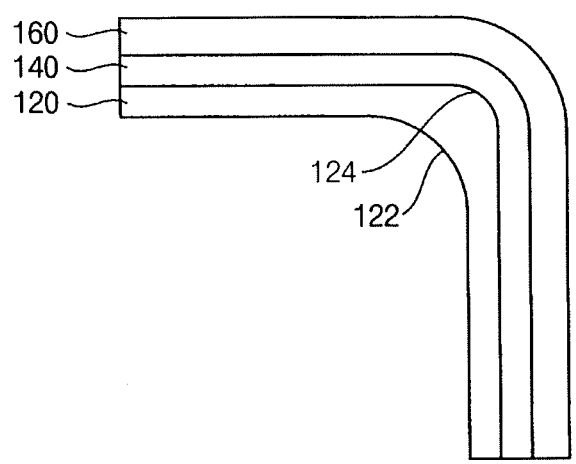

FIG. 5 illustrates a flow chart illustrating a method of manufacturing a window member in a curved display device according to example embodiments, and FIGS. 6A through 6C illustrate cross-sectional views describing an example of a method of manufacturing the window member of FIG. 5.

Referring to FIG. 5, the method of manufacturing the window member in the curved display device may form a window body 120 using an injection molding process (S110), may dispose a protection layer 160 on a transparent polymer resin layer 140 (S130), and may attach the transparent polymer resin layer 140 onto the window body 120 (S150).

Referring to FIGS. 5 and 6A, the window body 120 may be formed by an injection molding process that injects a melted transparent resin into a mold, so that the window body 120 may include at least one flat portion and at least one curved portion (S110). The curved portion may be disposed on a curved display region of the curved display device. In example embodiments, a first radius of curvature R1 of an inner surface 122 of the curved portion may be greater than a second radius of curvature R2 of an outer surface 124 of the curved portion. The mold may be designed such that a first molding side of the mold corresponding to the inner surface 122 of the curved portion of the window body 120 has a radius of curvature greater than that of a second molding side of the mold corresponding to the outer surface 124 of the curved portion of the window body 120. Thus, the window body 120 formed by the mold such that the first radius of curvature of the inner surface 122 of the curved portion may be greater than the second radius of curvature of the outer surface 124 of the curved portion. Further, the window body 120 may include a plurality of curved portions and may have various radiuses of curvature through various shapes of the mold. In example embodiments, a thickness of the curved portion of the window body 120 may be thicker than a thickness of the flat portion of the window body 120. Further, the flat portion may have uniform thickness. As these are described above, duplicative descriptions will not be repeated.

In example embodiments, a transparent resin included in the window body 120 may include at least one polycarbonate or polymethymethacrylate. However, the transparent resins applied to the window body 120 are not limited thereto. For example, the transparent resin may include a mixed plastic material including mixed PC and PMMA.

Referring to FIGS. 5 and 6B, the protection layer 160 may be disposed on (or, sprayed onto) the transparent polymer resin layer 140 (or, a transparent polymer resin sheet) (S130). The transparent polymer resin layer 140 may prevent a surface of the window body 120 from being damaged. In example embodiments, the transparent polymer resin layer 140 may include at least one polyethylene-terephthalate or polyimide. However, materials applied to the transparent polymer resin layer 140 are not limited thereto. For example, the transparent polymer resin layer 140 may include acrylic urethane, epoxy, polyester, etc.

The protection layer 160 may be disposed on the transparent polymer resin layer 140 to improve surface hardness of the window member 100. In example embodiments, the protection layer 160 may include a high hardness material having hardness substantially equal to and higher than 5H. The protection layer 160 may include a transparent material that is mixture of an organic material and an inorganic material. The protection layer 160 may be formed as a film or a coating layer on the transparent polymer resin layer 140. In example embodiments, the protection layer 160 may include an anti-reflection (coating) layer to prevent external light reflections and/or anti-fingerprint (coating) layer. However, functions of the protection layer 160 and materials in the protection layer 160 are not limited thereto. For example, the protection layer 160 may be act as an antifouling layer.

In example embodiments, an attaching material 180 may be attached to the inner surface of the transparent polymer resin layer 140. The attaching material 180 may act as attaching the transparent polymer resin layer 140 to the window body 120. In example embodiments, the attaching material may include at least one of optically clear adhesive (OCA) or a binder.

Because the transparent polymer resin layer 140 and protection layer 160 are described above, duplicative descriptions will not be repeated.

Referring to FIGS. 5 and 6C, the transparent polymer resin layer 140 may be attached onto the window body 120 (S150). An OCA and/or a binder may be sprayed onto an inner surface of the transparent polymer resin layer 140, or may be attached onto the inner surface of the transparent polymer resin layer 140. Then, the inner surface of the transparent polymer resin layer 140 may be attached onto an outer surface of the window body 120. Because the transparent polymer resin layer 140 may be flexible, the shape of the transparent polymer resin layer 140 may correspond to the shape of the outer surface of the window body 120. The transparent polymer resin layer 140 may be attached onto the window body 120 by a laminating process. However, the method of attaching the transparent polymer resin layer 140 onto the window body 120 is not limited thereto.

As described above, the method of manufacturing the window member of the curved display device may form the window body 120 where the first radius of curvature of the inner surface of the curved portion is greater than the second radius of curvature of the outer surface of the curved portion so that distortions of a curved display region may not appear. Further, the method of manufacturing the window member of the curved display device may form the curved portion without any additional process.

Figure 7A:
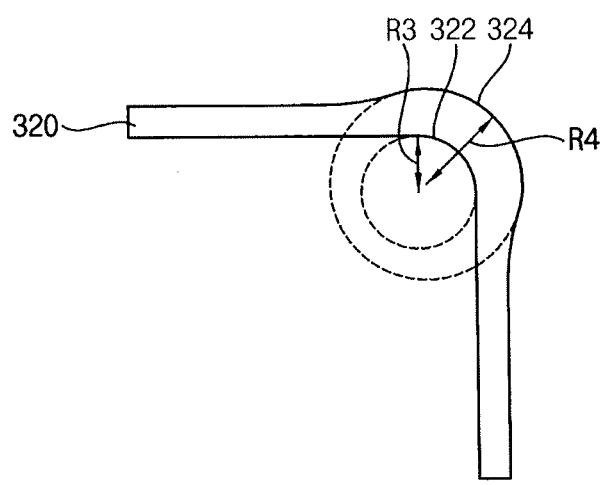
FIGS. 7A and 7B illustrate cross-sectional views describing another example of a method of manufacturing the window member of FIG. 5.
Figure 7B:
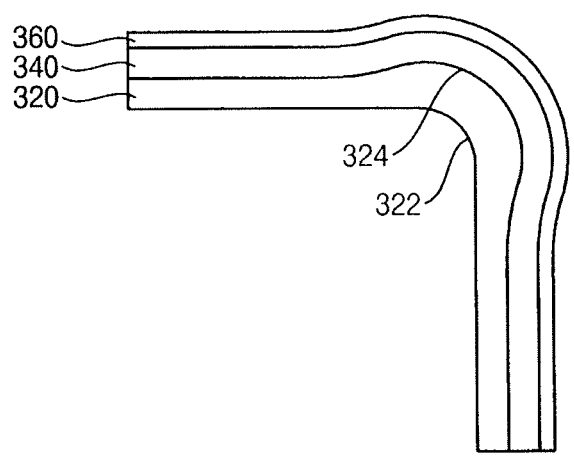

FIGS. 7A and 7B illustrate cross-sectional views describing another example of a method of manufacturing the window member of FIG. 5.

Referring to FIGS. 7A and 7B, the method of manufacturing the window member in the curved display device may form a window body 320 using an injection molding process, may dispose a protection layer 360 on a transparent polymer resin layer 340, and may attach the transparent polymer resin layer 340 onto the window body 120.

As illustrated in FIG. 7A, the window body 320 may be formed by an injection molding process that injects a melted transparent resin into a mold, so that the window body 320 may include at least one flat portion and at least one curved portion. In example embodiments, a first radius of curvature R3 of an inner surface 322 of the curved portion of the window body 320 may be smaller than a second radius of curvature R4 of an outer surface 324 of the curved portion of the window body 320. The mold may be designed such that a first molding side of the mold corresponding to the inner surface 322 of the curved portion of the window body 320 has a radius of curvature greater than that of a second molding side of the mold corresponding to the outer surface 324 of the curved portion of the window body 320. Thus, the window body 320 formed by the mold such that the first radius of curvature of the inner surface 322 of the curved portion may be smaller than the second radius of curvature of the outer surface 324 of the curved portion.

In example embodiments, a thickness of the curved portion of the window body 320 may be thicker than a thickness of the flat portion of the window body 320. Further, the flat portion may have uniform thickness. As these are described above, duplicative descriptions will not be repeated.

In example embodiments, the transparent resin included in the window body 320 may include at least one polycarbonate (PC) or polymethylmethacrylate (PMMA). However, the transparent resin in the window body 120 is not limited thereto.

As illustrated in FIG. 7B, the transparent polymer resin layer 340 may be attached onto the window body 320. The protection layer 360 may be formed on the transparent polymer resin layer 340. An OCA and/or a binder may be sprayed onto an inner surface of the transparent polymer resin layer 340, or may be attached onto the inner surface of the transparent polymer resin layer 340. Then, the inner surface of the transparent polymer resin layer 340 may be attached onto an outer surface of the window body 320. Because the transparent polymer resin layer 340 may be flexible, the shape of the transparent polymer resin layer 340 may correspond to the shape of the outer surface of the window body 320. Radiuses of curvature of inner surfaces of curved portions of the transparent polymer resin layer 340 and the protection layer 360 may be smaller than radiuses of curvature of outer surfaces of curved portions of the transparent polymer resin layer 340 and the protection layer 360, respectively.

Figure 8:
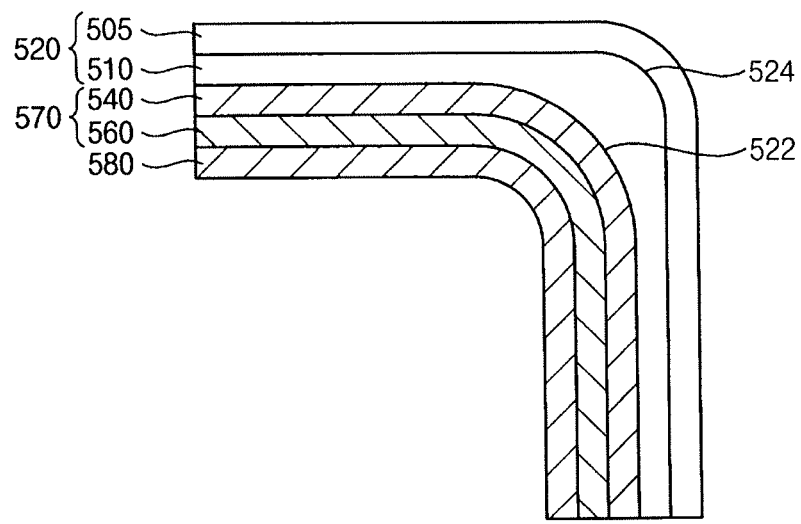
FIG. 8 illustrates a cross-sectional view illustrating a portion of a curved display device according to example embodiments.

FIG. 8 illustrates a cross-sectional view illustrating a portion of a curved display device according to example embodiments.

Referring to FIG. 8, the curved display device 500 may include a display panel 580 including at least one curved display region, a functional panel 570, and a window member 520.

The display panel 580 may include a plurality of pixels including a plurality of pixel circuits. The display panel 580 may include a scan driving unit, a data driving unit, a power unit, and a timing control unit to display images. Further, the display panel 580 may include a flexible substrate for designing the curved display device 500.

The functional panel 570 may be disposed on the display panel 580. In example embodiments, the functional panel 570 may include at least one of a protection film, a polarizing plate, and a touch screen panel. Because these are examples, the functional panels and locations of the functional panels are not limited thereto. Any panel (or, plate) may be included in the functional panel 570 to provide various functions to the curved display device 500. The functional panel 570 may include a flexible substrate to design the curved display device 500. The functional panel 570 may be attached onto the display panel 570 by OCA, binder, etc.

The window member 520 may be disposed on the functional panel 570. The window member 520 may include a window body 510 that includes a curved portion corresponding to the curved display region of the curved display device 500 and a flat portion. The window member 520 may protect inner panels (i.e., the display panel and the functional panel) of the curved display device 500 from external factors.

In example embodiments, the window member 520 may further include a transparent polymer resin layer 505 disposed on the window body 510, and a protection layer (not illustrated) disposed on the transparent polymer resin layer 505.

A first radius of curvature of inner surface 522 of the curved portion of the window body 510 may be different from a second radius of curvature of outer surface 524 of the curved portion of the window body 510. In example embodiments, the first radius of curvature may be greater than the second radius of curvature. Thus, unintended refraction of light and unintended light scattering may be reduced, so that shadows of a curved display region may not appear (or, may be reduced). In example embodiments, a thickness of the curved portion of the window body 501 may be thicker than a thickness of the flat portion of the window body because of difference between the first radius of curvature and the second radius of curvature. The flat portion may have uniform thickness. In example embodiments, the window body may be formed by an injection molding process that injects a melted transparent resin into a mold. As these are described above, duplicated descriptions will not be repeated.

In example embodiments, the transparent resin included in the window body 510 may include at least one polycarbonate or polymethylmethacrylate. In example embodiments, the transparent polymer resin layer 505 may include at least one polyethylene-terephthalate or polyimide. The protection layer may be disposed on (or, sprayed onto) the transparent polymer resin layer 505. The protection layer may include a mixture of a glass material and a transparent polymer resin. The protection layer may be formed as a film or a coating layer on the transparent polymer resin layer 505. As these are described above, duplicative descriptions will not be repeated.

As described above, the window body 510 of the window member 520 in the curved display device 500 may include the curved portion that the first radius of curvature of the inner surface 522 of the curved portion is greater than a second radius of curvature of an outer surface 524 of the curved portion. Thus, distortions and shadows of the curved display region may be reduced (or, may not appear), so that visibility of the curved display device 500 may be improved.

In addition, the display panel under the inner surface of the window body may be gently bent, and thus tension (or stress) applied to the display panel may be reduced.

Figure 9:
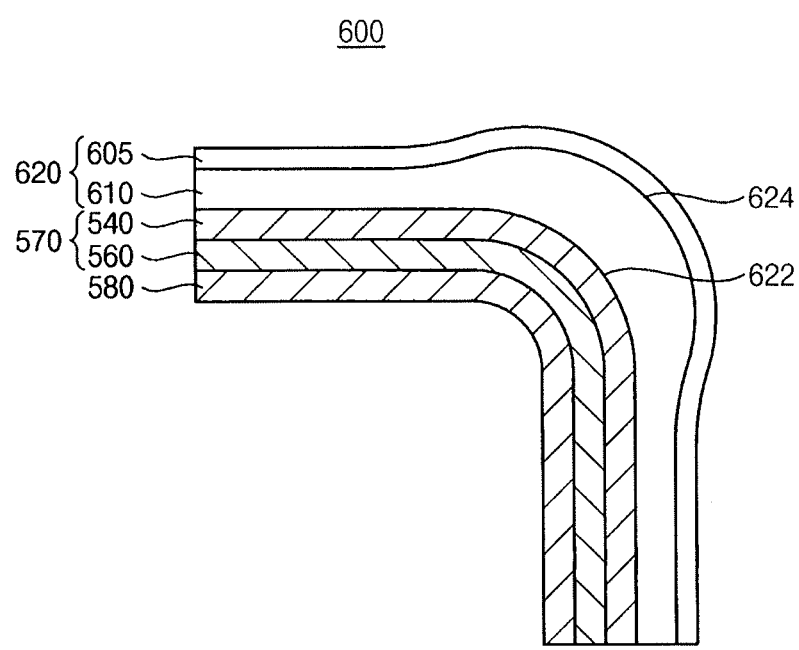
FIG. 9 illustrates a cross-sectional view illustrating a portion of a curved display device according to example embodiments.

FIG. 9 illustrates a cross-sectional view illustrating a portion of a curved display device according to example embodiments.

Referring to FIG. 9, the curved display device 600 may include a display panel 580 including at least one curved display region, a functional panel 570, and a window member 620. In FIG. 9, like reference numerals are used to designate elements the same as those in FIG. 8, and detailed description of these elements may be omitted. The curved display device 600 of FIG. 9 may be substantially the same as or similar to the curved display device 500 of FIG. 8 except for the shape a curved portion of the window member 620.

The window member 620 may be disposed on the functional panel 570. The window member 620 may include a window body 610 that includes a curved portion corresponding to the curved display region of the curved display device 600 and a flat portion. The window member 620 may protect inner panels (i.e., the display panel and the functional panel) of the curved display device 600 from external factors.

In example embodiments, the window member 620 may further include a transparent polymer resin layer 605 disposed on the window body 610, and a protection layer (not illustrated) disposed on the transparent polymer resin layer 605.

In example embodiments, a first radius of curvature of inner surface 622 of the curved portion of the window body 610 may be different from a second radius of curvature of outer surface 624 of the curved portion of the window body 610. Thus, unintended refraction of light and unintended light scattering may be reduced, so that shadows of a curved display region may not appear (or, may be reduced).

In example embodiments, a transparent resin included in the window body 610 may include at least one PC or PMMA. In example embodiments, the transparent polymer resin layer 605 may include at least one PET or PI.

The protection layer may be formed on (or, sprayed onto) the transparent polymer resin layer 605. The protection layer may include a mixture of a glass material and a transparent polymer resin. The protection layer may be formed as a film or a coating layer on the transparent polymer resin layer 605. As these are described above, duplicative descriptions will not be repeated.

As described above, the window body 610 of the window member 620 in the curved display device 600 may include the curved portion that the first radius of curvature of the inner surface 622 of the curved portion is smaller than a second radius of curvature of an outer surface 624 of the curved portion. Thus, distortions and shadows of the curved display region may be reduced (or, may not appear), so that visibility of the curved display device 600 may be improved.

The present embodiments may be applied to any curved display device, and to any electronic device including the curved display device. For example, the present embodiments may be applied to a television, a digital television, a three-dimensional television, a mobile phone, a smart phone, a laptop computer, a tablet computer, a personal digital assistants (PDA), a portable multimedia player (PMP), a digital camera, a music player, a portable game console, a navigation device, etc.

By way of summation and review, curved or flexible display devices may be thin, light, bendable, and more shock-resistant than flat panel display devices. Further, curved (or flexible) display devices can be designed in various shapes. In a curved display device, a window member may have the same thickness at a curved portion as at a flat portion. In this case, a shadow may be caused by the refraction of light at the curved display region according to an angle at which a user views the curved display device, and may result in image distortion.

In contrast, example embodiments provide a window member capable of preventing or reducing an image distortion at a curved portion.

A window member in a curved display device according to example embodiments may have a window body that is formed such that a radius of curvature of an inner surface of a curved portion of the window body is different from a radius of curvature of an outer surface of the curved portion of the window body, so that shadows of a curved display region may not appear or may be reduced.

Furthermore, a curved display device according to example embodiments may include the window member that has the first radius of curvature being greater than the second radius of curvature, so that image distortions at a curved display region may be prevented. A display panel under the inner surface of the window body may be more gently bent than other display panels, and thus tension or stress applied to the display panel may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A window member in a curved display device, comprising:
    a window body including a flat portion and a curved portion,
    wherein a first radius of curvature of an inner surface of the curved portion is greater than a second radius of curvature of an outer surface of the curved portion and a thickness of the curved portion is thicker than thicknesses of the flat portion.

2. The window member as claimed in claim 1, wherein the window body is formed by an injection molding process that injects a melted transparent resin into a mold.

3. The window member as claimed in claim 2, wherein the transparent resin includes at least one of polycarbonate (PC) or polymethylmethacrylate (PMMA).

4. The window member as claimed in claim 1, further comprising:
    a transparent polymer resin layer disposed on the window body; and
    a protection layer disposed on the transparent polymer resin layer.

5. The window member as claimed in claim 4, wherein the transparent polymer resin layer includes at least one of polyethylene-terephthalate (PET) or polyimide (PI).

6. The window member as claimed in claim 4, wherein the window body is attached to the transparent polymer resin layer by at least one of optically clear adhesive (OCA) or binder.

7. The window member as claimed in claim 4, wherein the protection layer includes an anti-reflection layer or an anti-fingerprint layer.

8. A method of manufacturing a window member of a curved display device, the method comprising:
    forming a window body having a flat portion and a curved portion by injecting a melted transparent resin into a mold;
    disposing a protection layer on a transparent polymer resin layer; and
    attaching the transparent polymer resin layer onto the window body,
    wherein a first radius of curvature of an inner surface of the curved portion greater than a second radius of curvature of an outer surface of the curved portion and a thickness of the curved portion is thicker than thicknesses of the flat portion.

9. The method as claimed in claim 8, wherein attaching the transparent polymer resin layer onto the window body includes:
    attaching at least one of optically clear adhesive (OCA) or binder to the transparent polymer resin layer; and
    attaching the transparent polymer resin layer to the window body with the at least one of the optically clear adhesive (OCA) or the binder.

10. The method as claimed in claim 8, wherein the transparent resin includes at least one of polycarbonate (PC) or polymethylmethacrylate (PMMA).

11. The method as claimed in claim 8, wherein the transparent polymer resin layer includes at least one of polyethylene-terephthalate (PET) or polyimide (PI).

12. The method as claimed in claim 8, wherein the protection layer includes an anti-reflection layer or an anti-fingerprint layer.

13. A curved display device comprising:
    a display panel including a curved display region;
    a functional panel on the display panel; and
    a window member on the functional panel, the window member including a window body including a curved portion corresponding to the curved display region of the display panel and a flat portion,
    wherein a first radius of curvature of an inner surface of the curved portion is greater than a second radius of curvature of an outer surface of the curved portion and a thickness of the curved portion is thicker than thicknesses of the flat portion.

* * * * *